(12) United States Patent
Gollier

(10) Patent No.: US 7,457,031 B1
(45) Date of Patent: Nov. 25, 2008

(54) OPTICAL CONFIGURATIONS FOR WAVELENGTH-CONVERTED LASER SOURCES

(75) Inventor: Jacques Gollier, Painted Post, NY (US)

(73) Assignee: Corning, Incorporated, Corning, NY (US)

( * ) Notice: Subject to any disclaimer, the term of this patent is extended or adjusted under 35 U.S.C. 154(b) by 29 days.

(21) Appl. No.: 11/880,250

(22) Filed: Jul. 20, 2007

(51) Int. Cl.
*G02F 1/35* (2006.01)
*G02B 6/32* (2006.01)

(52) U.S. Cl. .................... 359/326; 385/33; 385/122; 372/22

(58) Field of Classification Search ......... 359/326–332; 385/31, 33, 122; 372/21, 22
See application file for complete search history.

(56) References Cited

U.S. PATENT DOCUMENTS

| | | | |
|---|---|---|---|
| 5,173,962 A * | 12/1992 | Okamoto et al. | 385/122 |
| 5,216,729 A | 6/1993 | Berger et al. | 385/31 |
| 6,178,188 B1 | 1/2001 | Jing et al. | 372/36 |
| 2005/0081397 A1 | 4/2005 | Bonham et al. | 33/645 |
| 2005/0254532 A1 | 11/2005 | Van Saarloos | 372/24 |
| 2007/0091411 A1 | 4/2007 | Mori et al. | 359/239 |
| 2008/0019702 A1 | 1/2008 | Shibatani et al. | 398/182 |

FOREIGN PATENT DOCUMENTS

JP    2003-338795    11/2003

* cited by examiner

*Primary Examiner*—Hemang Sanghavi
(74) *Attorney, Agent, or Firm*—Kwadjo Adusei-Poku; Dinsmore & Shohl, LLP

(57) ABSTRACT

An optical package is provided comprising a semiconductor laser, a wavelength conversion device, a lens assembly, and one or more adjustable optical components. The lens assembly and the adjustable optical component are configured to direct an output beam of the semiconductor laser towards the input face of the wavelength conversion device and to vary the position of the output beam on the input face of the wavelength conversion device. The lens assembly and the adjustable optical component are further configured to define a folded optical path such that laser light propagating along the optical path from the semiconductor laser to the wavelength conversion device is collimated or nearly collimated by the lens assembly prior to being reflected by the adjustable optical component and is focused by the lens assembly on the input face of the wavelength conversion device after being reflected by the adjustable optical component. Additional embodiments are disclosed and claimed.

19 Claims, 1 Drawing Sheet

OPTICAL CONFIGURATIONS FOR WAVELENGTH-CONVERTED LASER SOURCES

SUMMARY OF THE INVENTION

The present invention relates generally to semiconductor lasers, laser controllers, optical packages, and other optical systems incorporating semiconductor lasers. More particularly, by way of illustration and not limitation, embodiments of the present invention relate generally to optical alignment in packages that include, inter alia, a semiconductor laser and a second harmonic generation (SHG) crystal or another type of wavelength conversion device.

Short wavelength light sources can be formed by combining a single-wavelength, relatively long semiconductor laser, such as an infrared or near-infrared distributed feedback (DFB) laser, distributed Bragg reflector (DBR) laser, or Fabry-Perot laser, with a light wavelength conversion device, such as a second harmonic generation (SHG) crystal. Typically, the SHG crystal is used to generate higher harmonic waves of the fundamental laser signal. To do so, the lasing wavelength is preferably tuned to the spectral center of the wavelength converting SHG crystal and the output of the laser is preferably aligned with the waveguide portion at the input face of the wavelength converting crystal.

Mode diameters of typical SHG crystals, such as MgO-doped periodically poled lithium niobate (PPLN) crystals, can be in the range of a few microns. As a result, the present inventors have recognized that it can be very challenging to align the beam from the laser diode and the waveguide of the SHG crystal properly. Accordingly, one object of the present invention is to provide optical configurations suitable for optical packages that utilize SHG crystals or other types of wavelength conversion devices to generate shorter wavelength radiation (e.g., green laser light) from a longer wavelength source (e.g., a near-infrared laser diode).

According to one embodiment of the present invention, an optical package is provided comprising a semiconductor laser, a wavelength conversion device, a lens assembly, and one or more adjustable optical components. The lens assembly and the adjustable optical component are configured to direct an output beam of the semiconductor laser towards the input face of the wavelength conversion device and to vary the position of the output beam on the input face of the wavelength conversion device. The lens assembly and the adjustable optical component are further configured to define a folded optical path such that laser light propagating along the optical path from the semiconductor laser to the wavelength conversion device is collimated or nearly collimated by the lens assembly prior to being reflected by the adjustable optical component and is focused by the lens assembly on the input face of the wavelength conversion device after being reflected by the adjustable optical component. Additional embodiments are disclosed and contemplated.

Further contemplated embodiments of the present invention relate to optical packages comprising laser controllers programmed to operate semiconductor lasers according to the concepts of the present invention. It is contemplated that various concepts of the present invention will be applicable to color image-forming laser projection systems, laser-based displays such as heads-up displays in automobiles, or any laser application where optical alignment and/or wavelength tuning are issues. It is further contemplated that the optical configurations discussed herein will have utility in the context of a variety of types of semiconductor lasers, including but not limited to DBR and DFB lasers, Fabry-Perot lasers, and many types of external cavity lasers.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
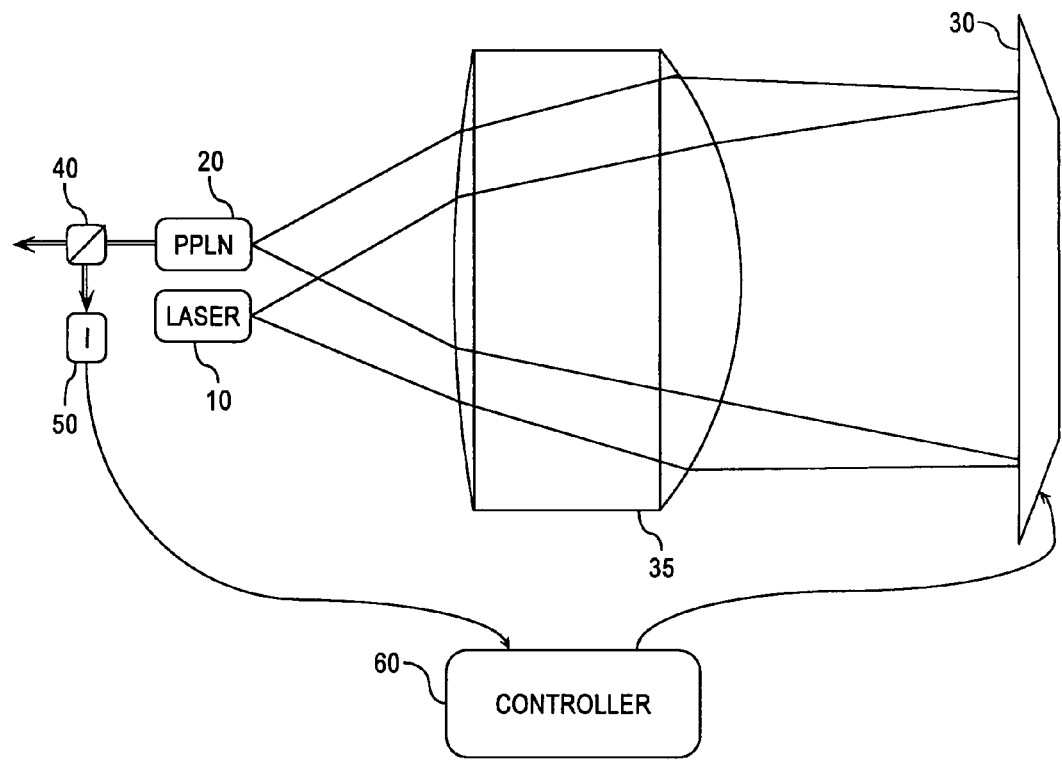
FIG. 1 is a schematic illustration of a MEMS mirror-enabled optical alignment package according to one embodiment of the present invention.

Referring initially to FIG. 1, although the general structure of the various types of optical packages in which the concepts of particular embodiments of the present invention can be incorporated is taught in readily available technical literature relating to the design and fabrication of frequency or wavelength-converted semiconductor laser sources, the concepts of particular embodiments of the present invention may be conveniently illustrated with general reference to an optical package including, for example, a semiconductor laser 10 and a wavelength conversion device 20. In the configuration of FIG. 1, the near infrared light emitted by the semiconductor laser 10 is coupled into the a waveguide portion of the wavelength conversion device 20 by one or more adjustable optical components 30 and a suitable optical assembly 35, which optical assembly 35 may comprise one or more optical elements of unitary or multi-component configuration. The optical package illustrated in FIG. 1 is particularly useful in generating a variety of shorter wavelength laser beams from a variety of longer wavelength semiconductor lasers and can be used, for example, as a visible laser source in a laser projection system.

Figure 2:
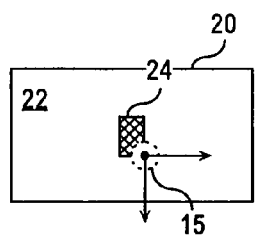
FIG. 2 is a schematic illustration of a beam spot on an input face of a wavelength conversion device.

The adjustable optical component 30 is particularly helpful because it is often difficult to focus the output beam emitted by the laser 10 into the waveguide portion of the wavelength conversion device 20. For example, mode diameters of typical SHG crystals, such as MgO-doped periodically poled lithium niobate (PPLN) crystals, can be in the range of a few microns. Referring to FIGS. 1 and 2 collectively, the optical assembly 35 cooperates with the adjustable optical component 30 to generate a beam spot 15 of comparable size on the face 22 of the wavelength conversion device 20. The adjustable optical component 30 is configured to introduce beam angular deviation when adjusted and, as such, can be used to actively align the beam spot 15 with the waveguide portion 24 of the wavelength conversion device 20 by altering the position of the beam spot 15 on the face 22 of the wavelength conversion device 20 until it is aligned with the waveguide portion 24 of the wavelength conversion device 20.

Although the present invention is not limited to any particular manner of determining proper alignment or degree of alignment, it is contemplated that alignment can be monitored by providing, for example, a beam splitter 40 and an intensity sensor 50 in the optical path of the wavelength converted output of the wavelength conversion device 20. A feedback controller 60 can be used to control the position or state of the adjustable optical component 30 as a function of the signal generated by the intensity sensor 50. It is further contemplated that alignment routines according to the present invention can be executed when setting-up an optical package, during operation of the optical package, or at any point in the life cycle of the optical package.

The adjustable optical component illustrated schematically in FIG. 3 can take a variety of conventional or yet to be developed forms. For example, it is contemplated that the adjustable optical component 30 may comprise one or more movable micro-opto-electromechanical mirrors, or other MEMS or MOEMS devices, that are configured and arranged to vary the position of the beam spot 15 on the input face 22 of the wavelength conversion device 20. Alternatively or additionally, the adjustable optical component 30 may comprise one or more liquid lens components configured for beam steering and/or beam focusing. Still further, it is contemplated that the adjustable optical component 30 may comprise one or more mirrors and/or lenses mounted to microactuators. In one contemplated embodiment, the adjustable optical component takes the form of a movable or adjustable lens in the optical assembly 35 and the otherwise adjustable optical component 30 takes the form of a fixed mirror.

Where the adjustable optical components comprise movable, micro-opto-electromechanical mirrors, the mirrors can be designed to decrease sensitivity to vibrations in the optical package by limiting the range of the deflection angle defined by the mirrors to values on the order of about 1 or 2 degrees, allowing the mirrors to be designed with relatively stiff flexures. Indeed, the present inventors have recognized that a range of one to two degrees is enough to cover lateral beam spot misalignments on the order of 50 to 100 microns depending on the focal length of the optical system. In the illustrated embodiment, the incidence angle over the surface of the adjustable optical component 30 can be maintained to be on the order of approximately 1-2 degrees because the laser light reflected by the mirror is directed back to the same lens assembly 35 from which it originated. As a result, any mirror curvature in the adjustable optical component 30, or other optical errors that would be exaggerated at higher incidence angles, can be readily corrected by the lens assembly 35 or another optical component in the optical path. Indeed, the present inventors have recognized that, when a mirror is used at small incidence angle, the effect of a mirror curvature is a change in the image focal position which can easily be corrected by moving one component along the optical axis of the lens. In contrast, when mirrors are used at relatively large incidence angles, mirror curvature can generate aberrations, such as astigmatism or coma, which are difficult to rectify by merely moving optical components.

In the optical configuration illustrated in FIG. 1, a micro-opto-electromechanical mirror 30 is incorporated in a relatively compact, folded-path optical system. In the illustrated configuration, the micro-opto-electromechanical mirror 30 is configured to fold the optical path such that it initially passes through the lens assembly 35 to reach the mirror 30 as a collimated or nearly collimated beam and subsequently returns through the same lens assembly 35 to be focused on the wavelength conversion device 20. This type of optical configuration is particularly applicable to wavelength converted laser sources, where the cross-sectional size of the laser beam generated by the semiconductor laser is close to the size of the waveguide on the input face of the wavelength conversion device 20, in which case a magnification close to one would yield optimum coupling in focusing the beam spot on the input face of the wavelength conversion device 20. For the purposes of defining and describing the present invention, it is noted that reference herein to a "collimated or nearly collimated" beam is intended to cover any beam configuration where the degree of beam divergence or convergence is reduced, directing the beam towards a more collimated state.

The lens assembly 35 can be described as dual function, collimating and focusing optical component because it serves to collimate and focus the laser light propagating along the optical path of the package. This dual function optical component is well suited for applications requiring magnification factors close to one because a single lens assembly 35 is used for both collimation and focusing. More specifically, as is illustrated in FIG. 1, laser light output from the semiconductor laser 10 is, in sequence, refracted at the first face 31 of the lens assembly 35, refracted at the second face 32 of the lens assembly 35, and reflected by the adjustable optical component 30 in the direction of the lens assembly 35. Once the laser light is reflected back in the direction of the lens assembly 35, it is first refracted at the second face 32 of the lens assembly 35 and subsequently refracted at the first face 31 of the lens assembly 35, for focusing on the input face of the wavelength conversion device 20.

In particular embodiments of the present invention, the adjustable optical component 30 is placed close enough to the image focal point of the lens assembly 35 to ensure that the principle ray incident on the input face 22 of the wavelength conversion device 20 is approximately parallel to the principle ray at the output of the optical package. It may also be shown that the configuration illustrated in FIG. 1 also presents some advantages in term of aberration. Indeed, when the output face of the semiconductor laser 10 and the input face of the wavelength conversion device 20 are positioned in approximate alignment with the object focal plane of the lens assembly 35 and the output waveguide of the semiconductor laser 10 and the input waveguide of the wavelength conversion device 20 are symmetric with respect to the optical axis of the lens assembly 35, it is contemplated that anti symmetric field aberrations, such as coma, can be automatically corrected.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. For example, the optical package may further comprise a focus adjustable optical component, such as a one or more liquid lens components, configured to vary the focus position of a beam spot generated by the semiconductor laser relative to the input face of the wavelength conversion device. Thus, it is intended that the present invention cover the modifications and variations of this invention provided they come within the scope of the appended claims and their equivalents.

For the purposes of describing and defining the present invention it is noted that the terms "substantially" and "approximately" are utilized herein to represent the inherent degree of uncertainty that may be attributed to any quantitative comparison, value, measurement, or other representation. The terms "substantially" and "approximately" are also utilized herein to represent the degree by which a quantitative representation may vary from a stated reference without resulting in a change in the basic function of the subject matter at issue.

Recitations herein of a component of the present invention being "configured" in a particular way or to embody a particular property or function, are structural recitations as opposed to recitations of intended use. For example, references herein to a lens assembly and an adjustable optical component being "configured" to direct a laser beam in a particular manner denotes an existing physical condition of the lens assembly and the adjustable optical component and, as such, is to be taken as a definite recitation of structural characteristics. It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

What is claimed is:

1. An optical package comprising a semiconductor laser, a wavelength conversion device, a lens assembly, and one or more adjustable optical components, wherein:
   the lens assembly and the adjustable optical component are configured to direct an output beam of the semiconductor laser towards the input face of the wavelength conversion device and to vary the position of the output beam on the input face of the wavelength conversion device; and
   the lens assembly and the adjustable optical component are further configured to define a folded optical path such that laser light propagating along the optical path from the semiconductor laser to the wavelength conversion device is first collimated or nearly collimated by the lens assembly prior to being reflected by the adjustable optical component and is focused by the same lens assembly on the input face of the wavelength conversion device after being reflected by the adjustable optical component.

2. An optical package as claimed in claim 1 wherein the lens assembly and the adjustable optical component are configured such that:
   laser light output from the semiconductor laser is, in sequence, refracted at a first face of the lens assembly, refracted at a second face of the lens assembly, and reflected by the adjustable optical component in the direction of the lens assembly; and
   once the laser light is reflected back in the direction of the lens assembly, it is first refracted at the second face of the lens assembly and subsequently refracted at the first face of the lens assembly for focusing on the input face of the wavelength conversion device.

3. An optical package as claimed in claim 1 wherein the adjustable optical component is placed close enough to the image focal point of the lens assembly to ensure that the principle ray incident on the input face of the wavelength conversion device is approximately parallel to the principle ray at the output of the optical package.

4. An optical package as claimed in claim 1 wherein the semiconductor laser, the wavelength conversion device, and the lens assembly are configured such that the output face of the semiconductor laser and the input face of the wavelength conversion device are positioned in approximate alignment with the object focal plane of the lens assembly.

5. An optical package as claimed in claim 1 wherein the semiconductor laser, the wavelength conversion device, and the lens assembly are configured such that the output waveguide of the semiconductor laser and the input waveguide of the wavelength conversion device are symmetric with respect to the optical axis of the lens assembly.

6. An optical package as claimed in claim 1 wherein the semiconductor laser, the wavelength conversion device, and the lens assembly are configured such that:
   the output face of the semiconductor laser and the input face of the wavelength conversion device are positioned in approximate alignment with the object focal plane of the lens assembly; and
   the output waveguide of the semiconductor laser and the input waveguide of the wavelength conversion device are symmetric with respect to the optical axis of the lens assembly.

7. An optical package as claimed in claim 1 wherein the lens assembly and the adjustable optical component are configured to fold the optical path such that it initially passes through the lens assembly to reach the adjustable optical component as a collimated or nearly collimated beam and subsequently returns through the same lens assembly to be focused on the wavelength conversion device.

8. An optical package as claimed in claim 7 wherein the lens assembly and the adjustable optical component are further configured such that the incidence angle of laser light propagating from the lens assembly over the surface of the adjustable optical component 30 is on the order of approximately 1-2 degrees.

9. An optical package as claimed in claim 1 wherein the semiconductor laser and the wavelength conversion device are configured such that the required optical magnification for focusing a beam spot of the output beam of the semiconductor laser on the input face of the wavelength conversion device is approximately equal to one.

10. An optical package as claimed in claim 1 wherein the semiconductor laser is configured for infrared or near-infrared laser emission and the wavelength conversion device is configured to convert the laser emission to a wavelength-converted green or blue emission.

11. An optical package as claimed in claim 1 wherein:
   the optical package further comprises an intensity sensor coupled to a feedback controller; and
   the intensity sensor is configured to monitor the intensity of a wavelength-converted output of the wavelength conversion device as the position of the output beam on the input face of the wavelength conversion device is varied.

12. An optical package as claimed in claim 11 wherein the feedback controller is configured to control a position or state of the adjustable optical component as a function of a signal generated by the intensity sensor.

13. An optical package as claimed in claim 1 wherein the adjustable optical component comprises one or more movable micro-opto-electromechanical mirrors configured and arranged to vary the position of a beam spot on the input face of the wavelength conversion device.

14. An optical package as claimed in claim 1 wherein the optical package further comprises a focus adjustable optical component configured to vary the focus position of a beam spot generated by the semiconductor laser relative to the input face of the wavelength conversion device.

15. An optical package as claimed in claim 1 wherein the optical package comprises a single lens forming the lens assembly and a single MEMS or MEOMS mirror forming the adjustable optical component.

16. An optical package as claimed in claim 1 wherein the adjustable optical components are configured to introduce beam angular deviation when adjusted.

17. An optical package as claimed in claim 1 wherein:
   the lens assembly comprises an adjustable lens component as the adjustable optical component; and
   the optical package further comprises a fixed mirror in the folded optical path.

18. An optical package comprising a semiconductor laser, a wavelength conversion device, a lens assembly, and one or more adjustable optical components, wherein:
   the lens assembly and the adjustable optical component are configured to direct an output beam of the semiconductor laser towards the input face of the wavelength conversion device and to vary the position of the output beam on the input face of the wavelength conversion device; and the lens assembly and the adjustable optical component are configured such that laser light output from the semiconductor laser is, in sequence, refracted at a first face of the lens assembly, refracted at a second face of the lens assembly, and reflected by the adjustable optical component in the direction of the lens assembly, and once the laser light is reflected back in the direction of the lens assembly, the laser light is first refracted at the second face of the lens assembly and subsequently refracted at the first face of the lens assembly for focusing on the input face of the wavelength conversion device.

19. An optical package comprising a semiconductor laser, a wavelength conversion device, a lens assembly, and one or more adjustable optical components, wherein the lens assembly and the adjustable optical component are configured such that:

an output beam of the semiconductor laser is directed towards the input face of the wavelength conversion device and to vary the position of the output beam on the input face of the wavelength conversion device;

the lens assembly and the adjustable optical component define a folded optical path such that laser light propagating along the optical path from the semiconductor laser to the wavelength conversion device is collimated or nearly collimated by the lens assembly prior to being reflected by the adjustable optical component and is focused by the lens assembly on the input face of the wavelength conversion device after being reflected by the adjustable optical component;

laser light output from the semiconductor laser is, in sequence, refracted at a first face of the lens assembly, refracted at a second face of the lens assembly, and reflected by the adjustable optical component in the direction of the lens assembly;

once the laser light is reflected back in the direction of the lens assembly, it is first refracted at the second face of the lens assembly and subsequently refracted at the first face of the lens assembly for focusing on the input face of the wavelength conversion device;

the adjustable optical component is placed close enough to the image focal point of the lens assembly to ensure that the optical path of the laser light propagating from the lens assembly to the wavelength conversion device is approximately perpendicular to the input face of the wavelength conversion device;

the lens assembly and the adjustable optical component fold the optical path such that it initially passes through the lens assembly to reach the adjustable optical component as a collimated or nearly collimated beam and subsequently returns through the same lens assembly to be focused on the wavelength conversion device;

the incidence angle of laser light propagating from the lens assembly over the surface of the adjustable optical component is on the order of approximately 1-2 degrees; and the required optical magnification for focusing a beam spot of the output beam of the semiconductor laser on the input face of the wavelength conversion device is approximately equal to one.

* * * * *